(12) United States Patent
Ovchinnikov et al.

(10) Patent No.: US 7,685,503 B2
(45) Date of Patent: Mar. 23, 2010

(54) FAST DECODING OF REED-SOLOMON CODE

(75) Inventors: Andrei Ovchinnikov, St. Petersburg (RU); Evguenii Krouk, St. Petersburg (RU); Andrey Efimov, St. Petersburg (RU); Andrey Belogolovy, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 943 days.

(21) Appl. No.: 11/472,833

(22) Filed: Jun. 21, 2006

(65) Prior Publication Data

US 2007/0300136 A1    Dec. 27, 2007

(51) Int. Cl.
*H03M 13/00* (2006.01)

(52) U.S. Cl. ........................ 714/784; 714/756

(58) Field of Classification Search .............. 714/784, 714/756
See application file for complete search history.

(56) References Cited

U.S. PATENT DOCUMENTS 6,356,555 B1 * 3/2002 Rakib et al. .............. 370/441

OTHER PUBLICATIONS

E. Costa, et al., "On computing the syndrome polynomial in Reed-Solomon decoder", Paper, Sep. 8, 2004.

P.V. Trifonov, et al., "A method for fast computation of the Fourier transform over a finite field", St. Petersburgh State Polytechnic University, 2003.

* cited by examiner

*Primary Examiner*—Guy J Lamarre
(74) *Attorney, Agent, or Firm*—Blakely, Sokoloff, Taylor & Zafman LLP

(57) ABSTRACT

A technique to perform fast decoding of a Reed-Solomon code. A first multiplier unit multiplies a matrix $B^h$ with a column vector v using common adders to produce a column vector v1. The vector v represents one of an error locator polynomial, an error evaluator polynomial, and a derivative polynomial for a (n, k) Reed-Solomon code. The matrix $B^h$ is over GF(2) including first h columns of a matrix B. A second multiplier unit multiplies non-unity components of a column vector A with non-zero components of the column vector v1 component-wise in GF(q) to produce a column vector v2, q being equal to n+1. A third multiplier unit multiplies diagonal sub-matrices of a matrix C with corresponding components of the column vector v2 in GF(2) to produce a column vector v3.

28 Claims, 16 Drawing Sheets

$$\underline{Y} = \begin{bmatrix} y_0 \\ y_1 \\ y_2 \\ y_3 \end{bmatrix} = \begin{bmatrix} 1 & 0 & 1 & 1 & 0 & 0 & 0 & 0 & 1 \\ 1 & 1 & 0 & 0 & 1 & 1 & 0 & 0 & 0 \\ 1 & 1 & 0 & 1 & 0 & 0 & 1 & 0 & 0 \\ 1 & 0 & 1 & 0 & 1 & 0 & 0 & 1 & 0 \end{bmatrix} \begin{bmatrix} x_0 & x_1 & x_2 & x_3 & x_4 & x_5 & x_6 & x_7 & x_8 \end{bmatrix} = \begin{bmatrix} x_0 + x_2 + x_3 + x_8 \\ x_0 + x_1 + x_4 + x_5 \\ x_0 + x_1 + x_3 + x_6 \\ x_0 + x_2 + x_4 + x_7 \end{bmatrix}$$

510 — $\underline{Y}$
520 — $A$
530 — $\underline{X}$
540, 551, 552, 553, 554

MATRIX C2

101100001
    110011000
    110100100
    101010010

MATRIX C4

1100001101100000000000000110
1011011010001011110000000000
1101101100001101100000000000
1011011011010000000111000000
1101101101100000000110000000
1010001010001010000000111000
1100001100001100000000110000
1010001011010000000000000111

MATRIX C8
```

FAST DECODING OF REED-SOLOMON CODE

BACKGROUND

1. Field of the Invention

Embodiments of the invention relate to the field of error correction technology, and more specifically, to Reed-Solomon code.

2. Description of Related Art

The Reed-Solomon code is a block-based error correcting code with a wide range of applications in digital communications and storage. It is typically used to correct errors in many systems including: storage devices (e.g., tape, compact disk, digital vide disk, barcodes, etc), wireless or mobile communications (e.g., cellular telephones, microwave links, etc), satellite communications, digital television, and high-speed modems. A Reed-Solomon codeword is generated using a special polynomial. All valid code-words are exactly divisible by the generator polynomial. A Reed-Solomon decoder attempts to identify the position and magnitude of up to t errors (or 2t erasures) and to correct the errors or erasures. Finding the symbol error locations typically involves solving simultaneous equations with t unknowns. In general, this includes finding an error locator polynomial and finding the symbol error values. Techniques to do this include the Berlekamp-Massey procedure to find the error-locator polynomial, the Chien search to determine the error positions by finding the zeros of the error locator polynomial, and the Forney algorithm to compute the error values. These techniques typically require evaluation of a polynomial at certain points.

Existing techniques to evaluate polynomial at certain points have a number of disadvantages. A popular technique is the Horner scheme. For a polynomial of degree n−1 and t roots, the Horner scheme needs tn additions and tn multiplications. The amount of computations may be high for many high-speed applications.

BRIEF DESCRIPTION OF THE DRAWINGS

Embodiments of invention may best be understood by referring to the following description and accompanying drawings that are used to illustrate embodiments of the invention. In the drawings:

FIG. 5A is a diagram illustrating a binary matrix multiplication according to one embodiment of the invention.

FIG. 9A is a diagram illustrating the binary (841×9) matrix $B^{(9)}$ according to one embodiment of the invention.

FIG. 9B is a diagram illustrating the binary (841×8) matrix $B^{(8)}$ according to one embodiment of the invention.

FIG. 9C is a diagram illustrating the binary (841×4) matrix $B^{(4)}$ according to one embodiment of the invention.

FIG. 10 is a diagram illustrating the vector A according to one embodiment of the invention.

FIG. 12 is a diagram illustrating the sub-matrices C2, C4, and C8 according to one embodiment of the invention.

FIG. 13 is a diagram illustrating the permutation π according to one embodiment of the invention.

DESCRIPTION

Figure 1A:
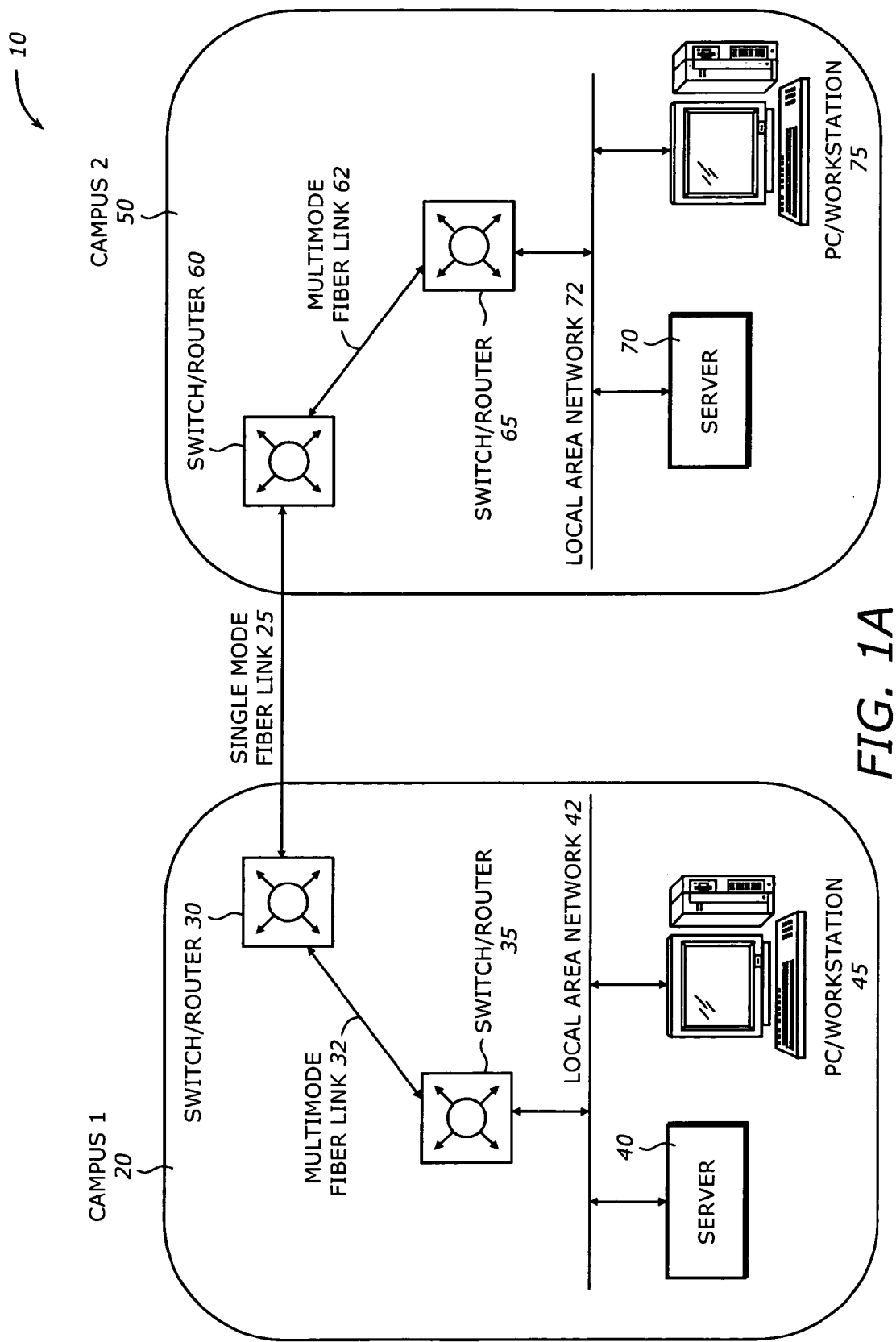
FIG. 1A is a diagram illustrating a network system in which one embodiment of the invention can be practiced.

An embodiment of the present invention is a technique to perform fast decoding of a Reed-Solomon code. A first multiplier unit multiplies a matrix $B^h$ with a column vector v using common adders to produce a column vector v1. The vector v represents one of an error locator polynomial, an error evaluator polynomial, and a derivative polynomial of the error locator polynomial for a (n, k) Reed-Solomon code. The matrix $B^h$ is over GF(2) including first h columns of a matrix B. A second multiplier unit multiplies non-unity components of a column vector A with non-zero components of the column vector v1 component-wise in GF(q) to produce a column vector v2, q being equal to n+1. A third multiplier unit multiplies diagonal sub-matrices of a matrix C with corresponding components of the column vector v2 in GF(2) to produce a column vector v3.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process, which is usually depicted as a flowchart, a flow diagram, a structure diagram, or a block diagram. Although a flowchart may describe the operations as a sequential process, many of the operations can be performed in parallel or concurrently. A loop or iterations in a flowchart may be described by a single iteration. It is understood that a loop index or loop indices or counter or counters are maintained to update the associated counters or pointers. In addition, the order of the operations may be re-arranged. A process terminates when its operations are completed. A process may correspond to a method, a program, a procedure, etc. A block diagram may contain blocks or modules that describe an element, an item, a component, a device, a unit, a subunit, a structure, a method, a process, a function, an operation, a functionality, or a task, etc. A functionality or an operation may be performed automatically or manually.

One embodiment of the invention is a technique to perform fast decoding of a (n, k) RS code using an efficient FFT evaluation of polynomials in determining error locations and error values. The RS codes are the class of alternate codes which possess the property of maximum achievable minimal distance d with given code length n and rate k/n, i.e., d=n−k+1, k is the number of data symbols. These codes are q-ary codes with n=q-1. In practice, the (255,239)-RS code is widely used. This code has the minimal distance of 17 and may correct up to 8 byte errors. Decoding of RS codes consists of several phases. Two important phases include finding the errors locators and determining the error values.

Let a, b, and e be the RS codeword, the received word, and the error. Then, b=a+e. The vector e describes the errors occurred during transmission. The decoding task is to find the vector e observing received vector b. Let e={$e_0, e_1, \ldots, e_{n-1}$} and $i_1, i_2, \ldots, i_t$ be positions of non-zero elements in e. For the case of (255,239) RS-code, t=8. The integers $i_j$'s are called the error locators. During the decoding of Reed-Solomon code, such as by means of a Berlekamp-Massey or Euclid procedure, a polynomial σ(x) is found where the degree of the polynomial σ(x) is t and $σ_0=1$. This polynomial is defined as $$\sigma(x) = \prod_{j=1}^{t} (1 - x\alpha^{i_j}) \quad (1)$$

where α is the primitive element of GF(q).

From equation (1), to find the error locators, one needs to find the t roots of σ(x). One method is to search through all q−1 non zero field elements. Given a vector f={$f_0, f_1, \ldots, f_{n-1}$} of length n over GF(q), the polynomial f(x) is said to be associated with f if:

$$f(x) = \sum_{i=0}^{n-1} f_i x^i \quad (2)$$

i.e., f(x) is a polynomial of degree n−1 over the GF(q). The Horner scheme may be used to find the value of f(x) at a point:

$$f(x) = f_0 + x(f_1 + x(f_2 + \ldots + x(f_{n-2} + xf_{n-1})\ldots)) \quad (3)$$

Equation (3) requires n additions and n multiplications to evaluate the polynomial at a point. Since the polynomial σ(x) has degree t, the total number of operations includes tn additions and tn multiplications.

One embodiment of the invention uses the discrete Fourier Transform (DFT) implemented as an FFT over the finite field with optimized calculations to improve the processing time and/or reduce hardware complexity. The DFT of a vector f of length n is defined as:

$$F_j = \sum_{i=0}^{n-1} f_i \alpha^{ij}, j = 0, \ldots, q-2 \quad (4)$$

The DFT effectively calculates the values of the polynomial f(x) in all q−1 non-zero points of finite field GF(q). Procedures for efficient evaluation of the DFT given in equation (4) exist. The FFT evaluation of equation (4) may be described as:

$$F = C \times (A * (B \times f)) \quad (5)$$

where A, B, and C are matrices with known components for specific values of (n, k) in the (n, k) RS code; (×) denotes matrix multiplication, and (*) denotes component-wise multiplication; the matrices B and C are the matrices over GF(2); and the matrices A, f and F are column vectors over GF(q).

From equation (5), the calculation of F uses multiplications in GF(q) only in (*) operation. The multiplication (×) is performed on binary matrices. Therefore, it uses only additions in GF(q). Moreover, since the degree of σ(x) is t, which is small compared to n, only a part of equation (5) need to be evaluated. These observations lead to an optimal sequence of operations to compute F from equation (5).

After the error locators are determined, the error values may be found using the Forney equation as follows:

$$e_i = -\frac{\omega(\alpha^{-i})}{\sigma'(\alpha^{-i})} \quad (6)$$

where σ'(x) is the formal derivative of σ(x), i is the error equation, ω(x) is the error evaluator polynomial. The error evaluator polynomial ω(x) may be found from the key equation during the Berlekamp-Massey procedure using the following condition:

$$\frac{\omega(x)}{\sigma(x)} \equiv S(x) \bmod x^t \quad (7)$$

The degree and form of the polynomial σ'(x) are known for known (n, k). For example, for the (255, 239) RS code, the degrees of the polynomial σ'(x) and ω(x) are 6 and 7, respectively. Moreover, the polynomial σ'(x) has the following form:

$$\sigma'(x) = \sigma_7 x^6 + \sigma_5 x^4 + \sigma_3 x^2 + \sigma_1 \quad (8)$$

The Horner scheme used to evaluate equation (8) requires 3 additions and 3 multiplications because σ'(x) may be rewritten as follows for the fields of characteristic 2:

$$\sigma'(x) = \sigma_1 + x^2(\sigma_3 + x^2(\sigma_5 + \sigma_7 x^2)) \quad (9)$$

Again, the evaluation of the polynomials ω(x) and σ'(x) may be efficiently performed by the FFT over the finite field as shown in equations (4) and (5). As in the case of error locators, the computations of the FFT for the polynomials ω(x) and σ'(x) may have a number of optimizations. These optimizations lead to more efficient computations than the Horner scheme.

FIG. 1A is a diagram illustrating a system 100 in which one embodiment of the invention can be practiced. The system 100 represents a Local Area Network (LAN) applications using 10 Gigabit Ethernet. The system 100 includes two campuses 20 and 50 and link 25.

Each of the campuses 20 and 50 represents an enterprise using network interconnections to link personal computers (PCs), workstations, and servers. They may have aggregation of multiple 1000BASE-X or 1000BASE-T segments into 10 Gigabit Ethernet downlinks. The link 25 may be a single mode fiber link that connects the two campuses 20 and 50 over a long distance (e.g., 40 km). The transmission of packets or data may be performed with error correction using error correction codes such as the Reed-Solomon code.

Campuses 20 and 50 may be similar in their infrastructure. The network in each campus may encompass buildings, data centers, or computer rooms. The campus 20 may include switches/routers, such as switch/router 30 and switch/router 35, and a LAN 42. The campus 50 may include switches/routers, such as switch/router 60 and switch/router 65, and a LAN 72. Switch/routers 30 and 60 are typically located at the edge of the corresponding campuses. They are connected together via the link 25. Switches/routers 30 and 35 are connected via a multimode fiber link 32 over shorter distances (e.g., 30-80 meters) at speed of up to 10 Gigabits per second (Gbps). The switch/router 35 is connected to the LAN 42. Similarly, switches/routers 60 and 65 are connected via a multimode fiber link 62 over shorter distances (e.g., 30-80 meters) at speed of up to 10 Gigabits per second (Gbps). The switch/router 65 is connected to the LAN 72.

The LAN 42 provides connectivity to servers, PCs, or workstations, such as a server 40 and a personal computer (PC)/workstation 45. Similarly, the LAN 72 provides network connectivity to servers, PCs, or workstations, such as a server 70 and a PC/workstation 75. The server 40 or 70 provides specific operations to support the computing environment. They may be a print server connected to a variety of printers, a storage server connected to mass storage devices such as tape drive, redundant arrays of inexpensive disks (RAIDs), a media server to provide multimedia services such as video, audio, or graphics, or any server with specific functions. Each server typically includes one or more network interface cards (NICs) with network connectivity to the corresponding LAN.

Figure 1B:
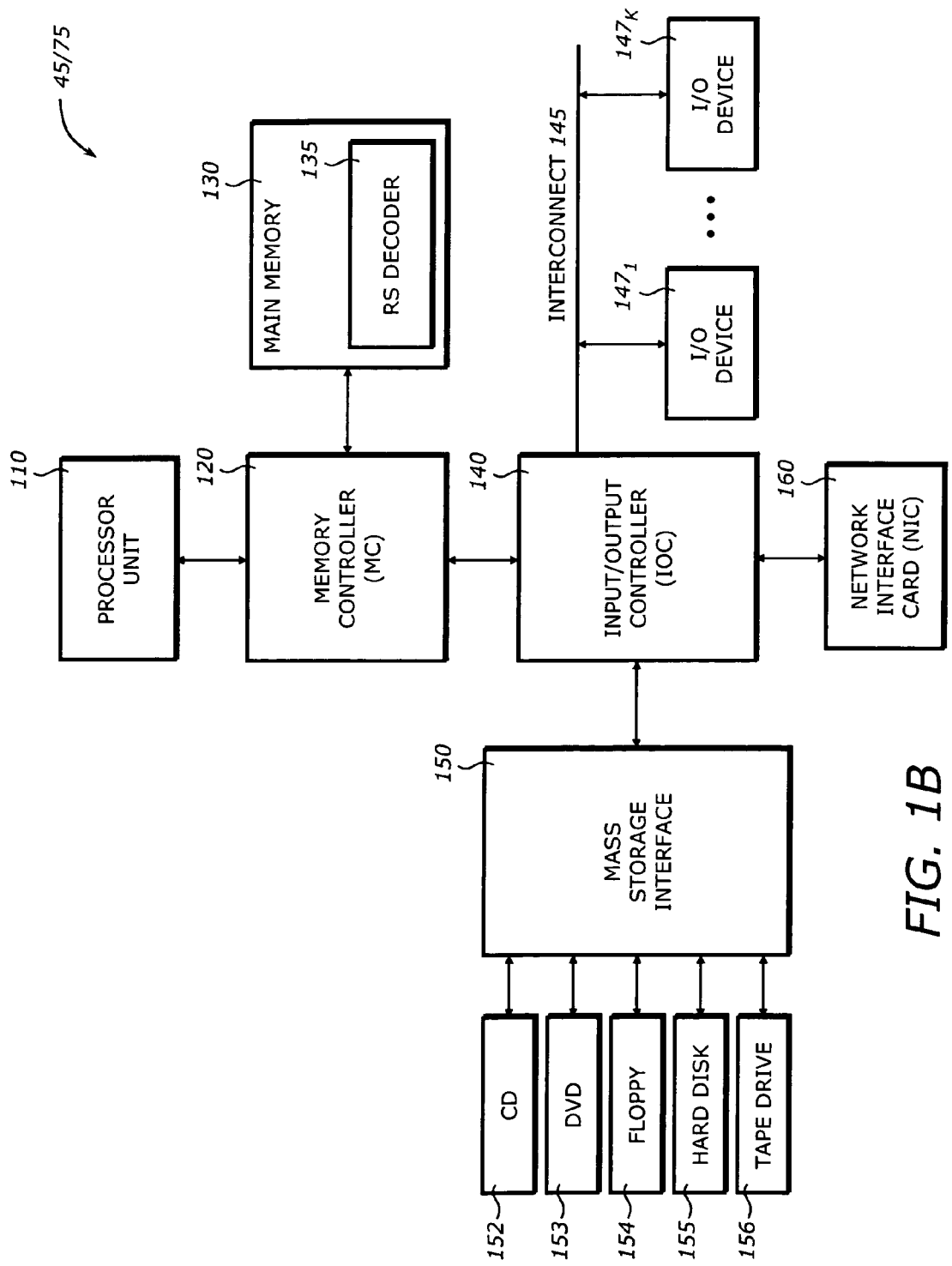
FIG. 1B is a diagram illustrating a processing system according to one embodiment of the invention.

FIG. 1B is a diagram illustrating the processing system 45/75 in which one embodiment of the invention can be practiced. The system 45/75 includes a processor unit 110, a memory controller (MC) 120, a main memory 130, an input/output controller (IOC) 140, an interconnect 145, a mass storage interface 150, input/output (I/O devices $147_1$ to $147_K$, and a network interface card (NIC) 160.

The processor unit 110 represents a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture.

The MC 120 provides control and configuration of memory and input/output devices such as the main memory 130 and the IOC 140. The MC 120 may be integrated into a chipset that integrates multiple functionalities such as graphics, media, isolated execution mode, host-to-peripheral bus interface, memory control, power management, etc. The MC 120 or the memory controller functionality in the MC 120 may be integrated in the processor unit 110. In some embodiments, the memory controller, either internal or external to the processor unit 110, may work for all cores or processors in the processor unit 110. In other embodiments, it may include different portions that may work separately for different cores or processors in the processor unit 110.

The main memory 130 stores system code and data. The main memory 130 is typically implemented with dynamic random access memory (DRAM), static random access memory (SRAM), or any other types of memories including those that do not need to be refreshed. The main memory 130 may include multiple channels of memory devices such as DRAMs. The DRAMs may include Double Data Rate (DDR2) devices with a bandwidth of 8.5 Gigabyte per second (GB/s). In one embodiment, the memory 130 includes a RS decoder 135 to decode a RS code. The decoder 135 may support a decoder unit. The decoder 135 or the decoder unit may be fully or partly implemented by hardware, firmware, or software, or any combination thereof. In addition, the decoder 135 or the decoder unit may be fully or partly located in the memory 130. The decoder 135, either located externally or internally to the memory 130, may be interfaced to the NIC 160 to decode packets or data received by the NIC 160.

The IOC 140 has a number of functionalities that are designed to support I/O functions. The IOC 140 may also be integrated into a chipset together or separate from the MC 120 to perform I/O functions. The IOC 140 may include a number of interface and I/O functions such as peripheral component interconnect (PCI) bus interface, processor interface, interrupt controller, direct memory access (DMA) controller, power management logic, timer, system management bus (SMBus), universal serial bus (USB) interface, mass storage interface, low pin count (LPC) interface, wireless interconnect, direct media interface (DMI), etc.

The interconnect 145 provides interface to peripheral devices. The interconnect 145 may be point-to-point or connected to multiple devices. For clarity, not all interconnects are shown. It is contemplated that the interconnect 145 may include any interconnect or bus such as Peripheral Component Interconnect (PCI), PCI Express, Universal Serial Bus (USB), Small Computer System Interface (SCSI), serial SCSI, and Direct Media Interface (DMI), etc.

The mass storage interface 150 interfaces to mass storage devices to store archive information such as code, programs, files, data, and applications. The mass storage interface may include SCSI, serial SCSI, Advanced Technology Attachment (ATA) (parallel and/or serial), Integrated Drive Electronics (IDE), enhanced IDE, ATA Packet Interface (ATAPI), etc. The mass storage device may include compact disk (CD) read-only memory (ROM) 152, digital video/versatile disc (DVD) 153, floppy drive 154, and hard drive 155, tape drive 156, and any other magnetic or optic storage devices. The mass storage device provides a mechanism to read machine-accessible media.

The I/O devices $147_1$ to $147_K$ may include any I/O devices to perform I/O functions. Examples of I/O devices $147_1$ to $147_K$ include controller for input devices (e.g., keyboard, mouse, trackball, pointing device), media card (e.g., audio, video, graphic), network card, and any other peripheral controllers.

The NIC 160 provides network connectivity to the server 40/70. The NIC 160 may generate interrupts as part of the processing of communication transactions. In one embodiment, the NIC 160 is compatible with both 32-bit and 64-bit peripheral component interconnect (PCI) bus standards. It is typically compliant with PCI local bus revision 2.2, PCI-X local bus revision 1.0, or PCI-Express standards. There may be more than one NIC 160 in the processing system. Typically, the NIC 160 supports standard Ethernet minimum and maximum frame sizes (64 to 1518 bytes), frame format, and Institute of Electronics and Electrical Engineers (IEEE) 802.2 Local Link Control (LLC) specifications. It may also support full-duplex Gigabit Ethernet interface, frame-based flow control, and other standards defining the physical layer and data link layer of wired Ethernet. It may be support copper Gigabit Ethernet defined by IEEE 802.3ab or fiber-optic Gigabit Ethernet defined by IEEE 802.3z.

The NIC 160 may also be a host bus adapter (HBA) such as a Small System Small Interface (SCSI) host adapter or a Fiber Channel (FC) host adapter. The SCSI host adapter may contain hardware and firmware on board to execute SCSI transactions or an adapter Basic Input/Output System (BIOS) to boot from a SCSI device or configure the SCSI host adapter. The FC host adapter may be used to interface to a Fiber Channel bus. It may operate at high speed (e.g., 2 Gbps) with auto speed negotiation with 1 Gbps Fiber Channel Storage Area Network (SANs). It may be supported by appropriate firmware or software to provide discovery, reporting, and management of local and remote HBAs with both in-band FC or out-of-band Internet Protocol (IP) support. It may have frame level multiplexing and out of order frame reassembly, on-board context cache for fabric support, and end-to-end data protection with hardware parity and cyclic redundancy code (CRC) support.

Figure 2:
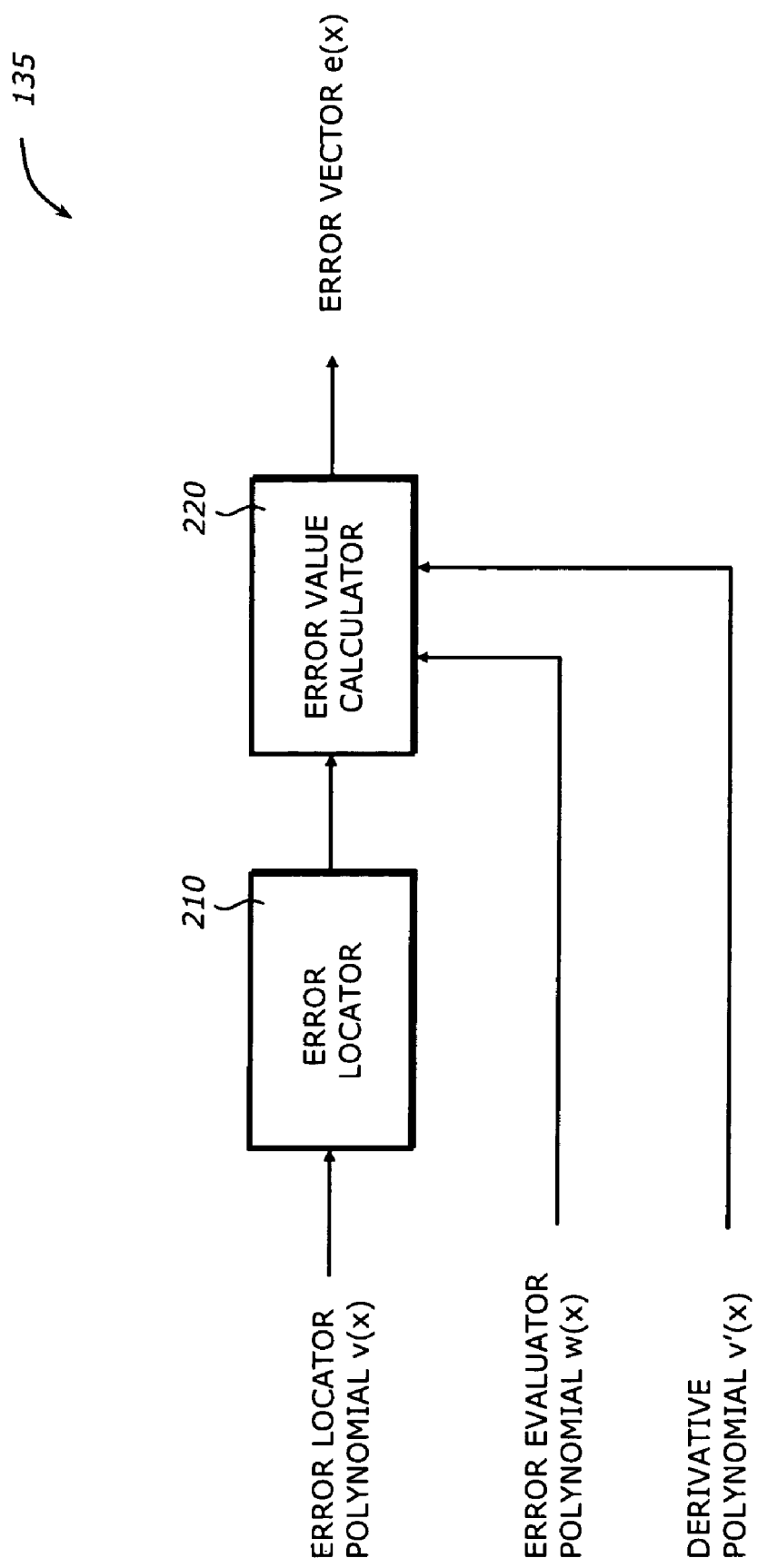
FIG. 2 is a diagram illustrating a decoder according to one embodiment of the invention.

FIG. 2 is a diagram illustrating the RS decoder 135 according to one embodiment of the invention. For simplicity, not all elements of the RS decoder 135 are shown. The decoder 135 includes an error locator 210 and an error value calculator 220.

The error locator 210 receives as input an error locator polynomial v(x) and generates a vector indicating the locations or positions of the errors. The error locator polynomial v(x) is essentially the polynomial σ(x) shown in equation (1). The error locator polynomial v(x) may have a degree of m (or t). The exact format of the input may be a column vector $\underline{v}$ whose components are the coefficients of the polynomial v(x). The number of components of the column vector $\underline{v}$ may be m+1. For the (255, 239) RS code, the degree of v(x) is 8. Accordingly, the error locator column vector $\underline{v}$ has 9 components.

The error value calculator 220 receives as inputs an error evaluator polynomial w(x) and a derivative polynomial v'(x) which is the derivative of the error locator polynomial v(x). It generates an error vector $\underline{e}$. The error evaluator polynomial w(x) and the derivative polynomial v'(x) are essentially the ω(x) and σ'(x) polynomials shown in Equation (6). For a (255, 239) RS code, the error evaluator polynomial w(x) has a degree p=7 and the derivative polynomial v'(x) also has a degree of 7. They are presented in column vectors $\underline{w}$ and $\underline{v}'$ to the error value calculator 220. The column vector $\underline{w}$ has 8 components and $\underline{v}'$ has 4 components.

Figure 3A:
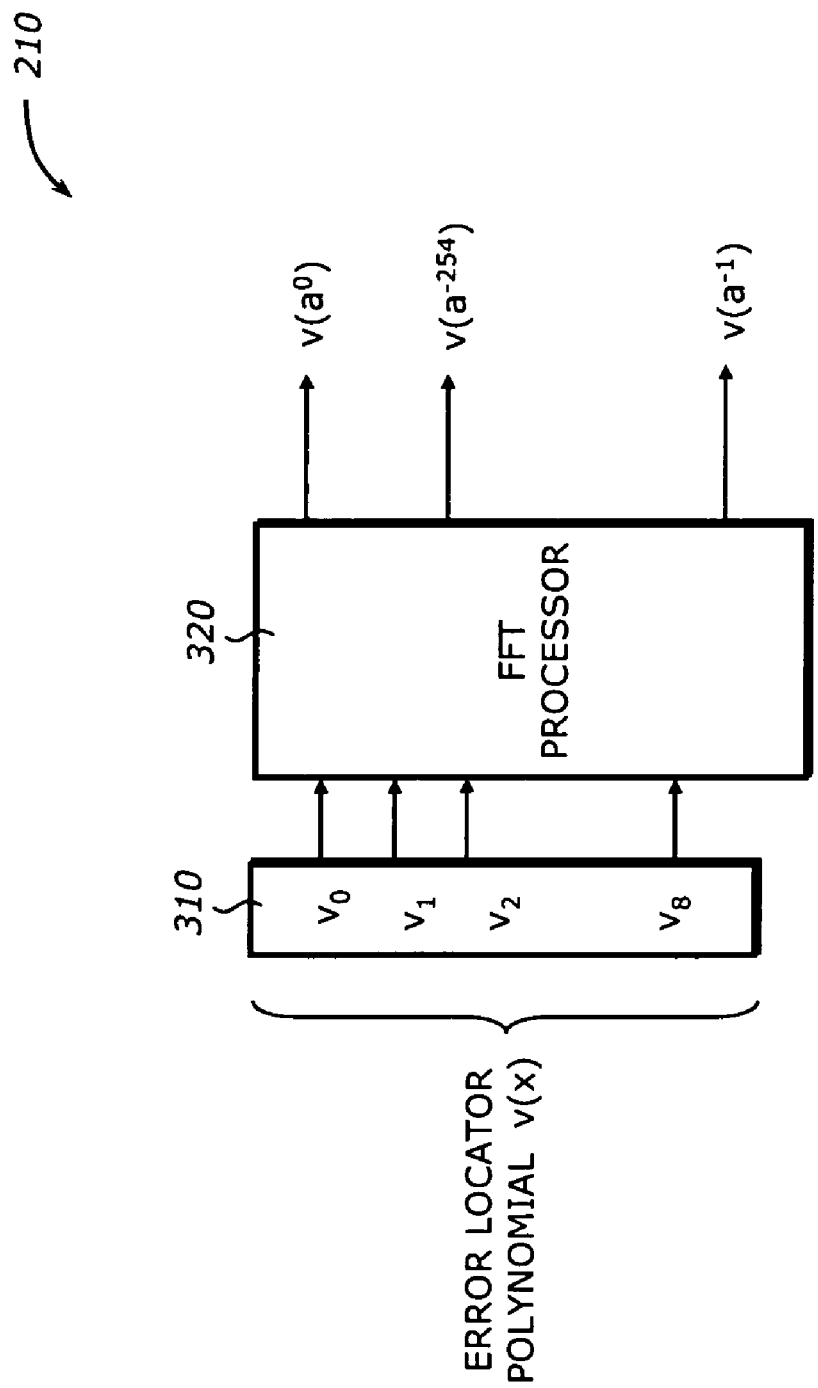
FIG. 3A is a diagram illustrating an error locator according to one embodiment of the invention.

FIG. 3A is a diagram illustrating the error locator 210 shown in FIG. 2 according to one embodiment of the invention. The error locator 210 includes a register 310 and a FFT processor 320.

The register 310 contains components of the column vector $\underline{v} = \{v_0, v_1, \ldots, v_8\}$. These are the coefficients of the error locator polynomial σ(x) in Equation (1).

The FFT processor 320 computes the FFT as given in Equation (5). The evaluation of the FFT in equation (5) may be reformulated as $$F = \pi(C \times (A^* (B^h \times \sigma))) \quad (10)$$

where π is a permutation operation, σ is the column vector whose components are the coefficients of the polynomial σ(x), $B^h$ is a matrix including the first h columns of the matrix B. The value of h depends on the degree m of the polynomial σ(x), h=m+1. For a (255, 239) RS code, m=8; thus $B^h$ is $B^{(9)}$ and is a matrix including the first 9 columns of the matrix B.

The outputs $v(a^{-i})$'s of the FFT processor 320 indicate the positions of the errors. After the permutation π, the FFT outputs $v(a^{-i})$'s are re-ordered such that a zero value output corresponds to the position of the error. In other words, a non-zero value at the outputs $v(a^{-i})$'s of the FFT processor 320 indicate a no-error condition.

Figure 3B:
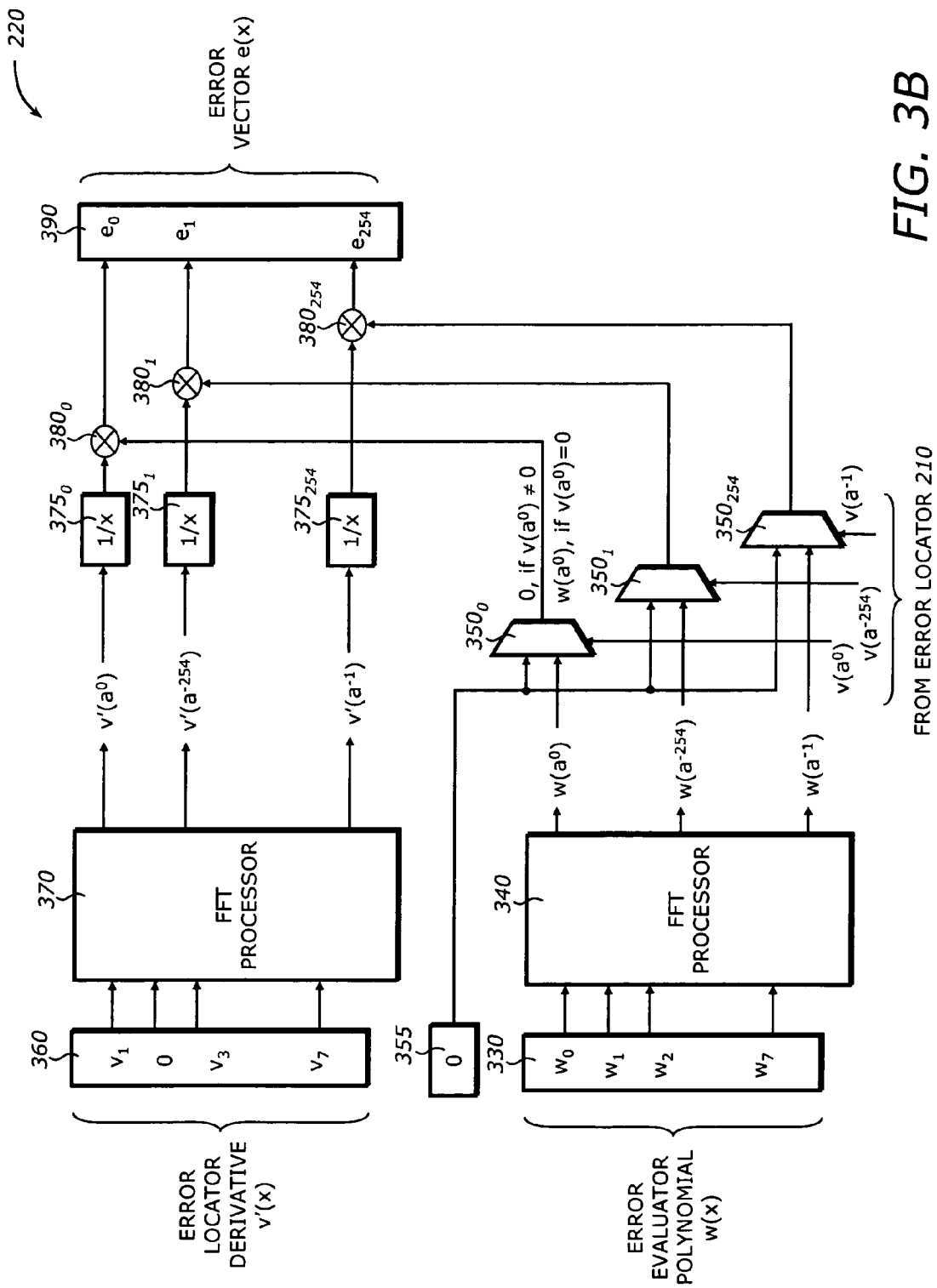
FIG. 3B is a diagram illustrating an error value calculator according to one embodiment of the invention.

FIG. 3B is a diagram illustrating the error value calculator 220 shown in FIG. 2 according to one embodiment of the invention. The error value calculator 220 includes registers 330, 360 and 390, FFT processors 340 and 370, data selectors $350_0$ to $350_{n-1}$, inverters $375_0$ to $375_{n-1}$, and multipliers $380_0$ to $380_{n-1}$.

The register 330 contains the column vector $\underline{w} = \{w_0, w_1, \ldots, w_p\}$ which represents the coefficients of the error evaluator polynomial w(x) having a degree p. The register 330, therefore has (p+1) components.

The FFT processors 340 and 370 are similar to the FFT processor 320 except that the matrix $B^h$ is different. For the FFT processor 340, h is equal to p+1 where p is the degree of the error evaluator polynomial ω(x). For the FFT processor 360, h is equal to a reduced form of the derivative polynomial σ'(x). For the (255, 239) RS code, the FFT processor 340 uses $B^{(8)}$ which includes the first 8 columns of the matrix B, and the FFT processor 370 uses $B^{(4)}$ which includes the first 4 columns of the matrix B. The matrices A, C, and the permutation π are the same as in the FFT processor 320.

The FFT processor 340 computes the FFT as follows:

$$F = \pi(C \times (A^* (B^h \times \omega))) \quad (11)$$

where π is a permutation operation, ω is the column vector whose components are the coefficients of the polynomial ω(x), $B^h$ is a matrix including the first h columns of the matrix B. The value of h depends on the degree p of the polynomial ω(x). For a (255, 239) RS code, p=7; thus $B^h$ is $B^{(8)}$ includes the first 8 columns of the matrix B.

The data selectors $350_0$ to $350_{n-1}$ select the zero value from a zero element 355 or the outputs of the FFT processor 340 according to the values $v(a^{-i})$'s provided by the error locator 210. For n=255, there are 255 data selectors or multiplexers. The outputs $v(a^{-i})$'s of the FFT processor 320 in the error locator 210 are used to select the inputs to the data selectors $350_0$ to $350_{n-1}$. Suppose the output $v(a^{-i})$ is connected to the selector input of the data selector $350_j$. If $v(a^{-i})$ is equal to zero indicating an error position, then the data selector $350_j$ selects the corresponding output $w(a^{-i})$ of the FFT processor 340. If $v(a^{-i})$ is not equal to zero, indicating that the corresponding position is not in error, then the data selector $350_j$ selects the zero element 355.

The register 360 contains the column vector $\underline{v}' = \{v1, v2, \ldots, v7\}$ which represents the coefficients of the derivative polynomial σ'(x). Since the error locator polynomial σ(x) has a degree of m, the derivative polynomial σ'(x) has a degree of m−1. The register 360 therefore has (m) components.

As discussed above, the FFT processor 370 is similar to the FFT processors 320 and 340, except that the matrix $B^h$ is a $B^{(4)}$ matrix which includes the first 4 columns of the matrix B. These columns are numbered 0, 2, 4, and 6. The matrices A, C, and the permutation π are the same as in the FFT processor 320.

The FFT processor 360 computes the FFT as follows:

$$F = \pi(C \times (A^* (B^h \times \sigma'))) \quad (12)$$

where π is a permutation operation, σ' is the column vector whose components are the coefficients of the polynomial σ'(x), $B^h$ is a matrix including the first h columns of the matrix B. The value of h depends on the form and the degree r of the polynomial σ'(x). For a (255, 239) RS code, the polynomial σ'(x) may be written in a reduced form such that h=4; thus $B^h$ is $B^{(4)}$ and is a matrix including the first 4 columns of the matrix B.

The inverters $375_0$ to $375_{n-1}$ perform the inverse operations (1/x) on the output $v'(a^{-i})$'s of the FFT processor 370. The multipliers $380_0$ to $380_{n-1}$ multiply the results of the inverters with the outputs of the corresponding data selectors $350_0$ to $350_{n-1}$. As discussed above, when the output $v(a^{-i})$ is zero indicating an error location, the data selector $350_j$ selects the output $w(a^{-i})$ from the FFT processor 340. This value is then multiplied with the inverse of the corresponding output of the FFT processor 370 to produce the error value $e_i$ at that error location i. When the output $v(a^{-i})$ is non-zero indicating a no error location, the data selector $350_j$ selects the zero value from the zero element 355. This value is then multiplied with the inverse of the corresponding output of the FFT processor 370 to produce a zero value for the corresponding $e_i$ at the location i. A zero value for the error value indicates that there is no error at that location.

The register 390 contains the error vector e(x). The error vector e(x) has n components. Each component corresponds to an error value at the component's location. As discussed above, a non-zero error value indicates that there is an error at that location. A zero error value indicates that there is no error at that location.

Figure 4:
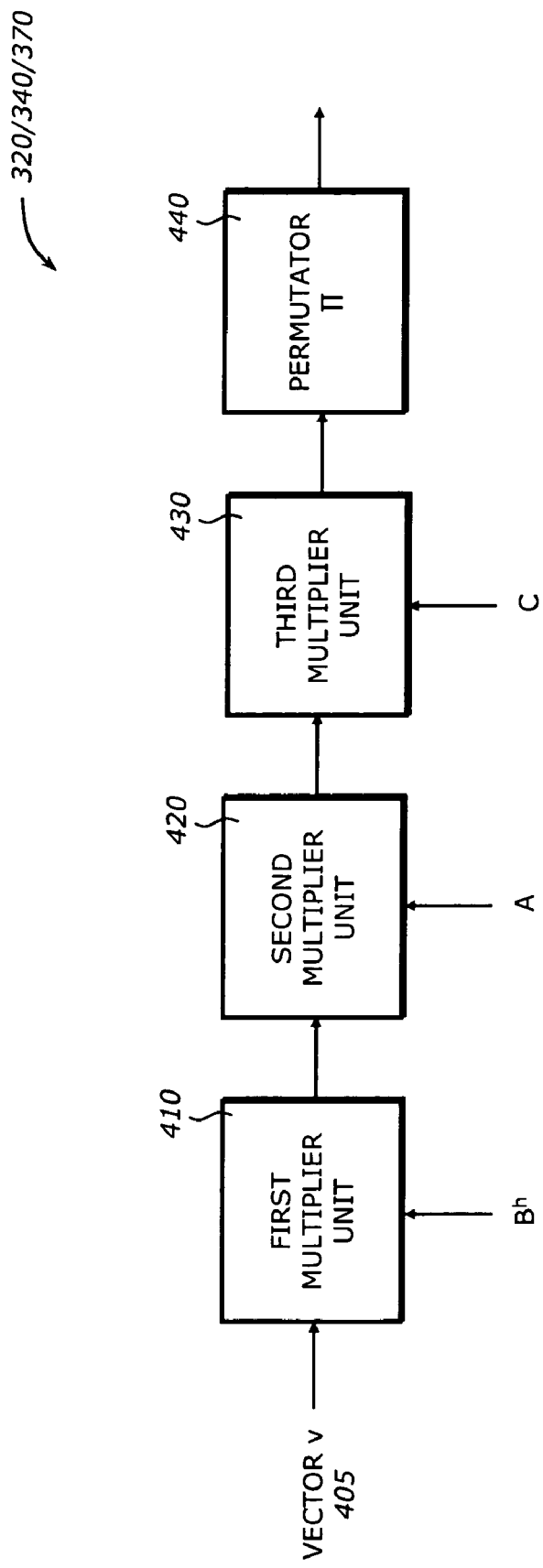
FIG. 4 is a diagram illustrating an FFT processor according to one embodiment of the invention.

FIG. 4 is a diagram illustrating the FFT processor 320/340/370 shown in FIGS. 3A and 3B according to one embodiment of the invention. The FFT processor 320/340/370 includes a first multiplier unit 410, a second multiplier unit 420, a third multiplier unit 430, and a permutator π 440. Note that although the term "multiplier" is used, the first and the third multiplier units 410 and 430 do not actually perform multiplication. The FFT processor 320/340/370 compute the FFT expression as:

$$F=\pi(C \times (A^*(B^h \times \overline{\omega}))) \quad (13)$$

where $\overline{\omega}$ is one of error locator polynomial σ'(x) of degree m, the error evaluator polynomial ω(x) of degree p, and the derivative polynomial σ'(x) as discussed above.

The first multiplier unit 410 performs the operation $(B^h \times v)$ to generate a column vector $v1=(B^h \times v)$, where v is a column vector representing one of the error locator polynomial σ(x), the error evaluator polynomial ω(x), and a derivative polynomial σ'(x), as shown in Equations (10), (11), and (12). The matrix $B^h$ may be a $B^{(9)}$, $B^{(8)}$, or $B^{(4)}$ matrix as discussed above. For known (n,k) values, the value of h in equations (11), (12), and (13) may be determined and the corresponding $B^h$ matrices may be determined in advance or pre-computed. The particular values of the matrix components may allow certain computational optimizations to be performed to speed up the processing time or reduce the hardware complexity.

For example, when n=255 and k=239, the following matrices may be obtained. The matrix $B^{(9)}$ is a binary (841×9) matrix shown in FIG. 9A. The matrix $B^{(8)}$ is a binary (841×8) matrix shown in FIG. 9B. The matrix $B^{(4)}$ is a binary (841×4) matrix shown in FIG. 9C. The result vector v1 is therefore an 841-component vector. Since these are binary matrices, the matrix multiplication is reduced to only additions. In addition, by decomposing the additions into multiple levels and utilizing common results of the additions, the number of additions may be reduced, resulting in faster computational time or less hardware complexity than the direct method or the Horner scheme.

The second multiplier unit 420 performs the operation $A^*(B^h \times v)$ to generate column vector $v2=A^*(B^h \times v)=A^*v1$. The matrix A is a column vector A. The multiplication (*) is a component-wise multiplication in Galois Field GF(q). For known (n,k) values, the vector A may be determined in advance or pre-computed. The particular values of the vector components of A may allow certain computation optimizations to be performed. For example, the vector A may contain unity-valued components. These components do not need to be multiplied. In addition, when components of the vector v1 are zero, the operation A*v1 with those components becomes zero. Although values of vector v1 are not known in advance, a test for zero on the components of v1 may be performed. This test may be simple or fast compared to the actual multiplication. In addition, since $B^h$ is known, any known zero values of $B^h$ translate into zero values in vector v1. Accordingly, these zero values may be known in advance and multiplication may be avoided. The component-wise multiplications, therefore, are performed only on non-unity components of A and non-zero components of the vector v1. When n=255 and k=239, the vector A has 841 components from $GF(2^8)$. There are 65 unity components. Therefore, the number of multiplications is reduced to 776. The actual values of the components of the vector A are shown in FIG. 10. This number may be further reduced if the vector v1 contains any zero components.

Figure 11:
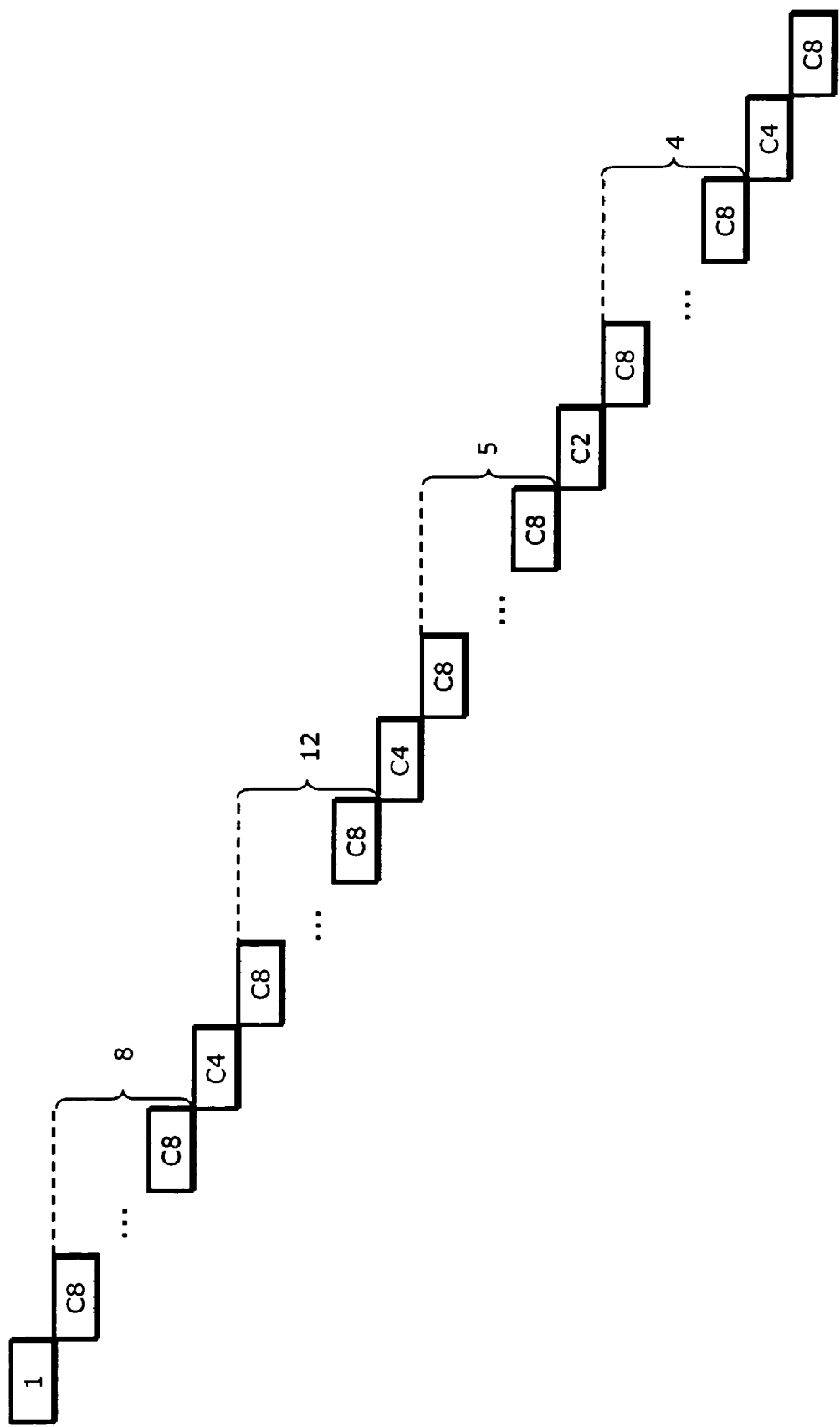
FIG. 11 is a diagram illustrating a matrix C with a block diagonal structure according to one embodiment of the invention.

The third multiplier unit 430 performs the operation C×A* $(B^h \times v)$ to generate a column vector v3=C×v2. C is a binary matrix. The multiplication is therefore performed on GF(2) and is reduced to additions. As discussed earlier, C has a block-diagonal structure with several sub-matrices located on its diagonal. The multiplication C×v2, therefore, may include multiplications of these sub-matrices with the corresponding components of the vector v2. For known (n,k) values, the sub-matrices of C may be determined in advance or pre-computed. The particular values of these sub-matrices may allow certain computation optimizations to be performed. For example, by decomposing the additions into multiple levels and utilizing common results of the additions, the number of additions may be reduced. When n=255 and k=239, the matrix C has three types of sub-matrices: C2 C4, and C8. The matrices C2, C4, and C8 are (2×3), (4×9), and (8×27), respectively, binary matrices. The arrangement of these sub-matrices is shown in FIG. 11. The particular values of these sub-matrices are shown in FIG. 12.

The permutator 440 performs a permutation π on the vector v3 which is the output of the third multiplier unit 430. The permutation π is a re-ordering of the components of the vector v3 as part of the FFT evaluation. The permutation operation takes only insignificant processing time relative to the overall processing time because it merely involves data switching, indexing, routing, or re-arrangement of the components. When n and k are known, the permutation may be determined in advance or pre-calculated. For n=255 and k=239, the values of the permutation π are shown in FIG. 13. The outputs of the FFT after the permutation may be re-ordered to reflect the fact that the positions of the errors are the values reciprocal to the roots of the polynomials. This permutation in essence replaces the division operation in the finite field. Alternatively, the permutation π and the output re-ordering may be combined into one operation.

Figure 5B:
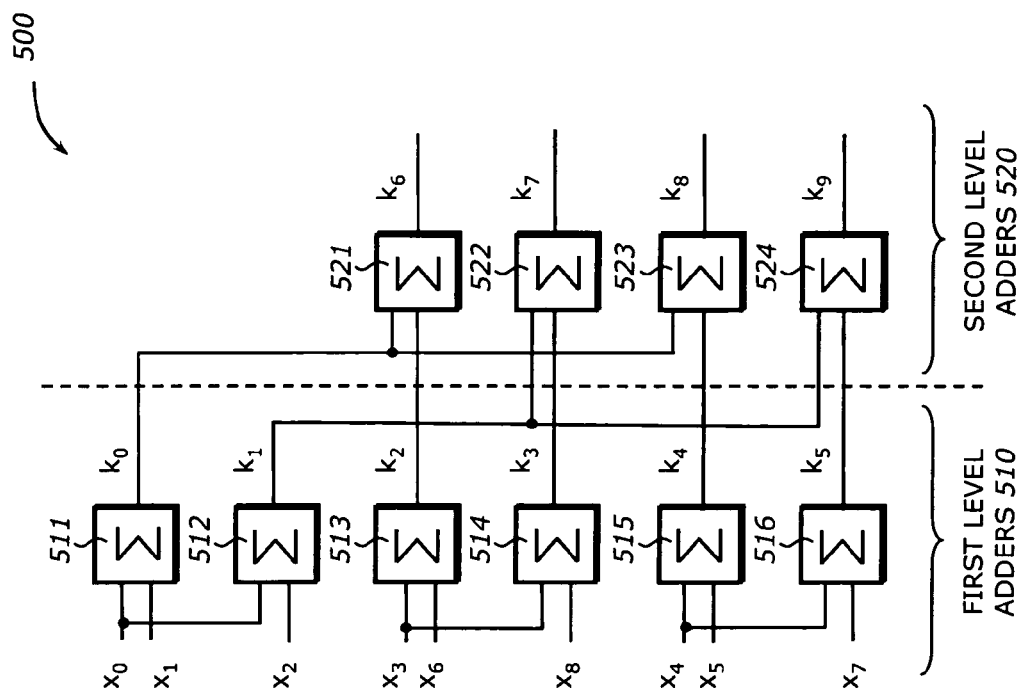
FIG. 5B is a diagram illustrating a matrix multiplier unit using common adders according to one embodiment of the invention.

As discussed above, the matrix multiplications performed in the first multiplier unit 410 and the third multiplier unit 430 may be reduced to additions because the matrices $B^h$ and C are binary matrices. When these values are known, certain optimizations may be performed as illustrated in FIGS. 5A and 5B FIG. 5A is a diagram illustrating a binary matrix multiplication according to one embodiment of the invention. FIG. 5A shows an example of a matrix multiplication Y=P*X where Y and X are column vectors and P is a binary matrix.

The vector Y 510 is a column vector Y={y0, y1, y2, y2}$^T$ where T indicates transpose for notational convenience. The vector X 530 is a column vector X={x0, x1, . . . , x8}$^T$. The matrix P 520 is a binary matrix. The matrix-vector multiplication gives:

$$y0 = x0 + x2 + x3 + x8$$
$$y1 = x0 + x1 + x4 + x5$$
$$y2 = x0 + x1 + x3 + x6$$
$$y3 = x0 + x2 + x4 + x7$$

It is noted that the additions of the pairs (x0, x1) and (x0, x2) occur twice as shown in blocks 551, 552, 553, and 554.

Therefore, these additions are common additions and their result may be shared by the next-level additions.

FIG. 5B is a diagram illustrating a matrix multiplier unit 500 using common adders according to one embodiment of the invention. The matrix multiplier unit 500 implements the matrix-vector multiplication shown in FIG. 5A. It includes two levels: a number of first-level adders 510 and a number of second-level adders 520.

The first-level adders 510 include adders 511, 512, 513, 514, 515, and 516. The adder 511 performs k0=x0+x1. The adder 512 performs k1=x0+x2. The adder 513 performs k2=x3+x6. The adder 514 performs k3=x3+x8. The adder 515 performs k4=x4+ x5. The adder 516 performs k5=x4+x7.

The second-level adders 520 include adders 521, 522, 523, and 524. The adder 521 performs k6=k0+k2. The adder 522 performs k7=k1+k3. The adder 523 performs k8=k0+k4. The adder 524 performs k9=k1+k5. The adders 521 and 523 share the same input k0 from the adder 511. The adders 522 and 524 share the same input k1 from the adder 512.

The adders 521 and 523 form a subset of adders in the second-level adders to share the same input from the output of the common adder 511. The adders 522 and 524 form another subset of adders to share the same input from the output of the common adder 512. By using the common adders, the number of adders or additions to implement the matrix-vector is reduced. For example, a direct computation of the matrix-multiplication shown in FIG. 5A requires 12 adders or additions. The scheme shown in FIG. 5B uses only 10 adders or additions. It is noted that the procedure may be extended to more than two levels. The common adders may be located in any intermediate levels to produce intermediate results.

Figure 6:
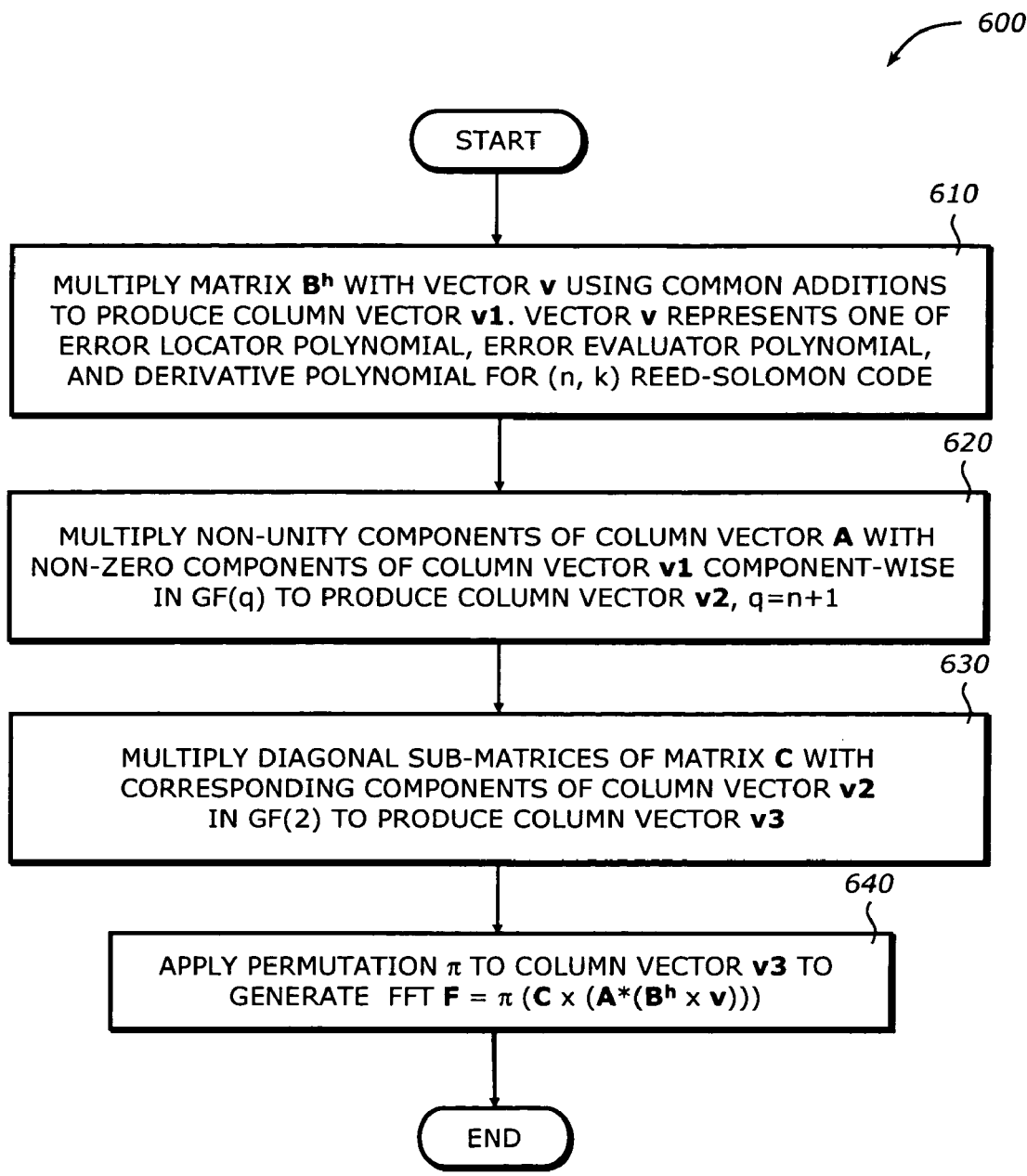
FIG. 6 is a flowchart illustrating a process to perform the FFT according to one embodiment of the invention.

FIG. 6 is a flowchart illustrating a process 600 to perform the FFT according to one embodiment of the invention.

Upon START, the process 600 multiplies a matrix $B^h$ with a vector v using common additions to produce a column vector v1 (Block 610). The vector v represents one of an error locator polynomial of degree m, an error evaluator polynomial of degree p, and a derivative polynomial for a (n,k) RS code. The matrix $B^h$ is over GF(2) including first h columns of a matrix B.

Next, the process 600 multiplies non-unity components of a column vector A with non-zero components of the column vector v1 component-wise in GF(q) to produce a column vector v2 (Block 620) where q is equal to n+1. Then, the process 600 multiplies diagonal sub-matrices of a matrix C with corresponding components of the column vector v2 in GF(2) to produce a column vector v3 (Block 630). Next, the process 600 applies a permutation π to the column vector v3 to generate a Fast Fourier Transform (FFT) F=π (C×(A*($B^h$× v))) (Block 640) and is then terminated. The operation (x) denotes a matrix multiplication and the operation (*) denotes a component-wise multiplication.

Figure 7:
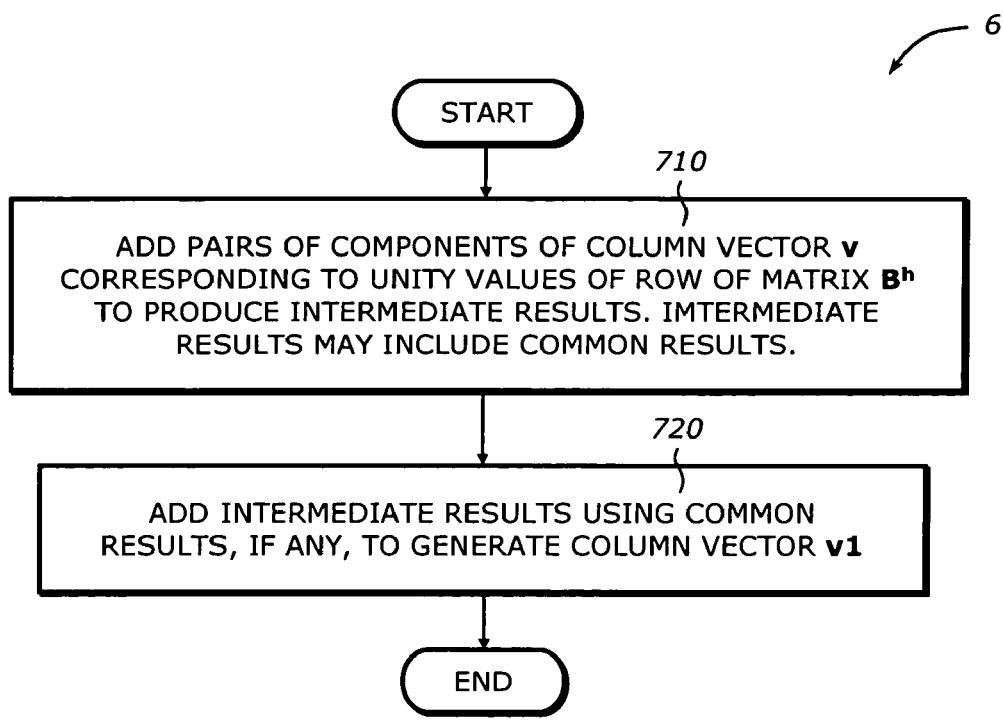
FIG. 7 is a flowchart illustrating a process to multiply the matrix $B^h$ with the vector v according to one embodiment of the invention.

FIG. 7 is a flowchart illustrating the process 610 to multiply the matrix $B^h$ with the vector v according to one embodiment of the invention.

Upon START, the process 610 adds pairs of components of the column vector v corresponding to unity values of a row of the matrix $B^h$ to produce intermediate results (Block 710). The intermediate results may include common results from common adders/additions. Next, the process 610 adds the intermediate results using the common results, if any, to generate the column vector v1 (Block 720) and is then terminated.

Figure 8:
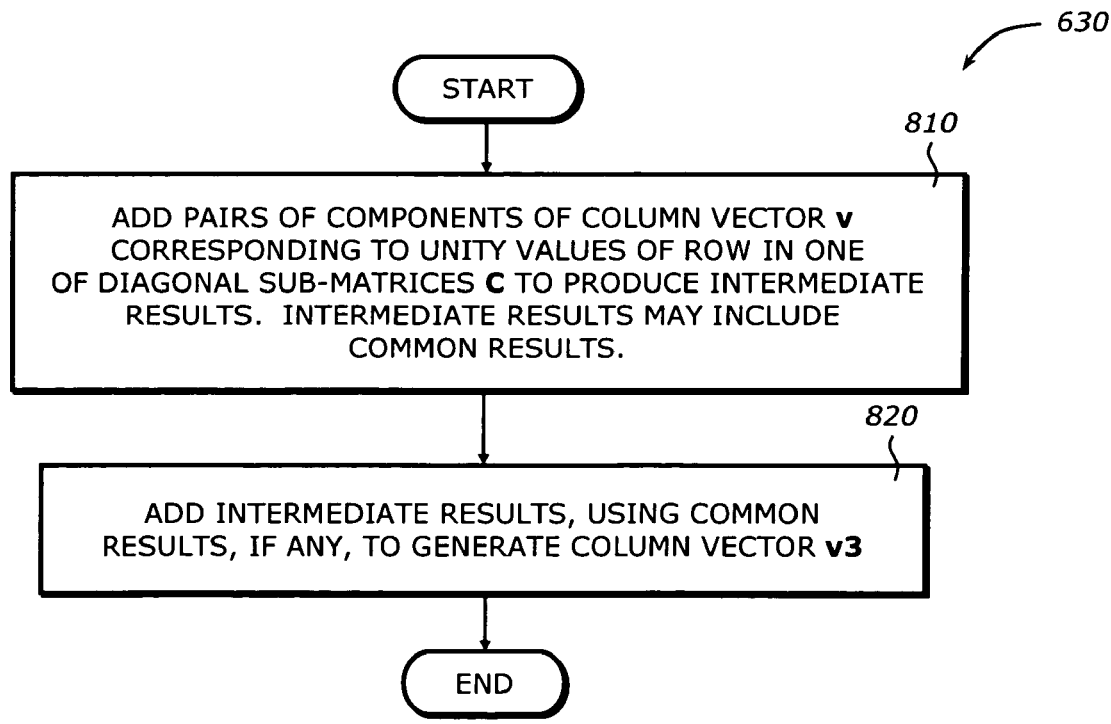
FIG. 8 is a flowchart illustrating a process to multiply the diagonal sub-matrices with the corresponding components of the column vector v2 according to one embodiment of the invention.

FIG. 8 is a flowchart illustrating the process 630 to multiply the diagonal sub-matrices with the corresponding components of the column vector v2 according to one embodiment of the invention.

Upon START, the process 630 adds pairs of components of the column vector v corresponding to unity values of a row in one of the diagonal sub-matrices of the matrix C to produce intermediate results (Block 810). The intermediate results may include common results from common adders/additions. Next, the process 630 adds the intermediate results using the common results, if any, to generate the column vector v3 (Block 820) and is then terminated.

FIGS. 9A through 13 show specific implementation of the error locator 210 and the error value calculator 220 for n=255 and k=239. These include the specific values of the components of the matrices A, B, C, and the permutation π. A comparison with the Horner scheme shows a marked reduction of number of operations.

FIG. 9A is a diagram illustrating the binary (841×9) matrix $B^{(9)}$ according to one embodiment of the invention. The matrix is presented in hexadecimal form, where 9-bit rows are replaced by 3 hexadecimal values. The rows should be read in columns, top-down, and then from left to right. FIG. 9A consists of two parts. The upper part shows the upper rows of $B^{(9)}$, and the lower part shows the lower rows.

The multiplication on the matrix $B^{(9)}$ takes a total of 240 additions to produce k0 through k239 values as shown below. The input is a 9-component vector x={x0, x1, ..., x8} and the output is a 841-component vector y={y0, y1, ..., y840} There are many common additions in the intermediate results. For example, k5 is a common addition used to compute k43, k46, k65, k66, k85, k133, k134, k184, k211, k212, k213, and k214.

k0 = x1 + x4
k1 = x2 + x8
k2 = x3 + x6
k3 = x5 + x7
k4 = k0 + k1
k5 = k2 + k3
k6 = x5 + k2
k7 = x7 + k2
k8 = x3 + x5
k9 = x1 + x2
k10 = x3 + k3
k11 = x6 + k3
k12 = x2 + x4
k13 = x6 + x7
k14 = x1 + x8
k15 = k4 + k5
k16 = x4 + x8
k17 = x3 + x7
k18 = x5 + x6
k19 = k2 + k4
k20 = k4 + k7
k21 = x1 + k1
k22 = x4 + k1
k23 = x8 + k0
k24 = k3 + k4
k25 = x2 + k0
k26 = x7 + k4
k27 = x5 + k4
k28 = k0 + k8
k29 = k1 + k17
k30 = k4 + k13
k31 = k0 + k3
k32 = k0 + k11
k33 = k9 + k10
k34 = k0 + k6
k35 = k4 + k10
k36 = k8 + k16
k37 = x3 + k1
k38 = x3 + k9
k39 = x6 + k1
k40 = k0 + k2
k41 = k11 + k12

-continued

```
k42 = x7 + k1
k43 = k0 + k5
k44 = k0 + k10
k45 = k1 + k3
k46 = k1 + k5
k47 = k4 + k17
k48 = k4 + k18
k49 = k6 + k12
k50 = k8 + k12
k51 = x2 + k13
k52 = x5 + k16
k53 = x8 + k11
k54 = k0 + k18
k55 = k1 + k7
k56 = k1 + k11
k57 = x0 + k14
k58 = x2 + x6
k59 = x4 + k6
k60 = x4 + k11
k61 = x6 + k12
k62 = x6 + k22
k63 = k1 + k10
k64 = k2 + k23
k65 = k5 + k9
k66 = k5 + k21
k67 = k7 + k12
k68 = k7 + k16
k69 = k9 + k13
k70 = k13 + k16
k71 = x0 + x3
k72 = x0 + k22
k73 = x0 + k25
k74 = x3 + k21
k75 = x5 + k9
k76 = x5 + k14
k77 = x6 + k0
k78 = k0 + k17
k79 = k1 + k8
k80 = k2 + k22
k81 = k3 + k9
k82 = k3 + k12
k83 = k3 + k16
k84 = k4 + k11
k85 = k5 + k12
k86 = k7 + k9
k87 = k7 + k14
k88 = k8 + k9
k89 = k8 + k23
k90 = k10 + k23
k91 = k13 + k14
k92 = k14 + k18
k93 = x0 + k6
k94 = x0 + k21
k95 = x0 + k60
k96 = x1 + k2
k97 = x1 + k3
k98 = x1 + k6
k99 = x1 + k8
k100 = x1 + k17
k101 = x2 + k3
k102 = x2 + k10
k103 = x2 + k11
k104 = x2 + k17
k105 = x3 + k4
k106 = x3 + k16
k107 = x3 + k25
k108 = x4 + x5
k109 = x4 + x6
k110 = x4 + x7
k111 = x4 + k10
k112 = x5 + k1
k113 = x5 + k12
k114 = x5 + k25
k115 = x6 + x8
k116 = x6 + k4
k117 = x6 + k9
k118 = x7 + k0
k119 = x7 + k9
k120 = x7 + k14
k121 = x8 + k2
k122 = x8 + k7
k123 = x8 + k13
k124 = x8 + k17
k125 = k1 + k2
k126 = k1 + k13
k127 = k2 + k9
k128 = k2 + k16
k129 = k3 + k14
k130 = k3 + k21
k131 = k3 + k22
k132 = k4 + k6
k133 = k5 + k14
k134 = k5 + k22
k135 = k6 + k16
k136 = k6 + k22
k137 = k7 + k21
k138 = k7 + k25
k139 = k8 + k25
k140 = k9 + k18
k141 = k10 + k14
k142 = k10 + k25
k143 = k11 + k14
k144 = k11 + k23
k145 = k12 + k13
k146 = k12 + k18
k147 = k13 + k22
k148 = k13 + k23
k149 = k13 + k25
k150 = k18 + k25
k151 = x0 + x2
k152 = x0 + x8
k153 = x0 + k15
k154 = x0 + k18
k155 = x0 + k28
k156 = x0 + k33
k157 = x0 + k35
k158 = x0 + k36
k159 = x0 + k43
k160 = x0 + k45
k161 = x0 + k56
k162 = x0 + k61
k163 = x0 + k64
k164 = x0 + k79
k165 = x0 + k100
k166 = x0 + k113
k167 = x1 + x6
k168 = x1 + x7
k169 = x1 + k10
k170 = x1 + k13
k171 = x1 + k18
k172 = x2 + x3
k173 = x2 + x7
k174 = x2 + k6
k175 = x2 + k8
k176 = x2 + k71
k177 = x3 + x4
k178 = x3 + x8
k179 = x3 + k12
k180 = x3 + k14
k181 = x3 + k22
k182 = x4 + k2
k183 = x4 + k3
k184 = x4 + k5
k185 = x4 + k17
k186 = x5 + x8
k187 = x5 + k0
k188 = x5 + k21
k189 = x5 + k23
k190 = x5 + k57
k191 = x5 + k73
k192 = x6 + k21
k193 = x6 + k23
k194 = x6 + k25
k195 = x7 + x8
k196 = x7 + k12
k197 = x7 + k21
k198 = x7 + k22
k199 = x7 + k25
```

-continued

```
k200 = x7 + k72
k201 = x8 + k3
k202 = x8 + k6
k203 = x8 + k18
k204 = x8 + k71
k205 = k0 + k7
k206 = k1 + k6
k207 = k1 + k93
k208 = k2 + k14
k209 = k3 + k23
k210 = k3 + k57
k211 = k5 + k23
k212 = k5 + k57
k213 = k5 + k72
k214 = k5 + k73
k215 = k6 + k14
k216 = k6 + k21
k217 = k6 + k23
k218 = k6 + k25
k219 = k7 + k22
k220 = k7 + k23
k221 = k7 + k151
k222 = k8 + k14
k223 = k8 + k94
k224 = k9 + k17
k225 = k10 + k12
k226 = k10 + k16
k227 = k10 + k21
k228 = k10 + k72
k229 = k10 + k94
k230 = k11 + k16
k231 = k11 + k25
k232 = k13 + k73
k233 = k14 + k17
k234 = k16 + k18
k235 = k17 + k22
k236 = k17 + k23
k237 = k18 + k21
k238 = k18 + k57
k239 = k23 + k93
```

The output vector y={y0, y1, ..., y840} may be determined from the above results. For illustrative purposes, only parts of the results are shown below.

```
y0 = k153
y1 = k152
y2 = k108
y3 = k76
y4 = k38
...
y830 = x5
y831 = x5
...
y838 = k19
y839 = x5
y840 = x5
```

FIG. 9B is a diagram illustrating the binary (841×8) matrix $B^{(8)}$ according to one embodiment of the invention. The matrix is presented in hexadecimal form, where 8-bit rows are replaced by 2 hexadecimal values. The rows should be read in columns, top-down, and then from left to right. FIG. 9B consists of two parts. The upper part shows the upper rows of $B^{(8)}$, and the lower part shows the lower rows.

The multiplication on the matrix $B^{(8)}$ takes a total of 149 additions to produce k0 through k148 values as shown below. The input is an 8-component vector x={x0, x1, ..., x7} and the output is a 841-component vector y={y0, y1, ..., y840}.

```
k0 = x1 + x4
k1 = x3 + x6
k2 = x5 + x7
k3 = x2 + k0
k4 = k1 + k2
k5 = x1 + x2
k6 = x2 + x4
k7 = x5 + k1
k8 = x7 + k3
k9 = x3 + x5
k10 = x3 + k2
k11 = x6 + k2
k12 = x7 + k1
k13 = k3 + k4
k14 = x5 + x6
k15 = x6 + x7
k16 = k1 + k8
k17 = k1 + k3
k18 = x3 + x7
k19 = k2 + k3
k20 = x5 + k3
k21 = x6 + k8
k22 = k0 + k9
k23 = x2 + k18
k24 = x2 + x6
k25 = k0 + k1
k26 = k0 + k11
k27 = k5 + k10
k28 = x3 + k5
k29 = k0 + k2
k30 = k0 + k7
k31 = k3 + k10
k32 = x2 + x3
k33 = k0 + k10
k34 = x2 + k2
k35 = x4 + k9
k36 = x6 + k6
k37 = k3 + k14
k38 = k4 + k5
k39 = k6 + k7
k40 = x2 + x7
k41 = x2 + k11
k42 = x2 + k15
k43 = x4 + x5
k44 = k0 + k4
k45 = k6 + k11
k46 = x2 + k4
k47 = x2 + k10
k48 = x2 + k12
k49 = x3 + k8
k50 = x4 + k7
k51 = x4 + k6
k52 = k6 + k9
k53 = x0 + x1
k54 = x4 + k11
k55 = k0 + k14
k56 = k2 + k5
k57 = k2 + k6
k58 = k5 + k12
k59 = k6 + k12
k60 = x1 + k2
k61 = x1 + k14
k62 = x1 + k15
k63 = x2 + k9
k64 = x3 + k3
k65 = x4 + k2
k66 = x4 + k12
k67 = x4 + k15
k68 = x5 + k5
k69 = x6 + k0
k70 = k0 + k18
k71 = k3 + k11
k72 = k5 + k9
k73 = k5 + k15
k74 = k6 + k15
k75 = k0 + k6
k76 = x1 + x5
k77 = x1 + x7
k78 = x1 + k1
```

-continued

```
k79  = x1 + k7
k80  = x1 + k9
k81  = x1 + k10
k82  = x1 + k12
k83  = x2 + k7
k84  = x3 + x4
k85  = x4 + k1
k86  = x4 + k10
k87  = x6 + k3
k88  = x6 + k5
k89  = x7 + k5
k90  = k1 + k6
k91  = k3 + k7
k92  = k5 + k14
k93  = x0 + x3
k94  = x0 + k13
k95  = x0 + k27
k96  = x0 + k54
k97  = x1 + k4
k98  = x1 + k11
k99  = x1 + k18
k100 = x2 + x5
k101 = x2 + k1
k102 = x3 + k6
k103 = x4 + x6
k104 = x4 + x7
k105 = x5 + k0
k106 = x7 + k0
k107 = x7 + k6
k108 = k0 + k12
k109 = k0 + k15
k110 = k1 + k5
k111 = k3 + k9
k112 = k6 + k14
k113 = x0 + k14
k114 = x0 + k20
k115 = x0 + k21
k116 = x0 + k22
k117 = x0 + k25
k118 = x0 + k30
k119 = x0 + k31
k120 = x0 + k32
k121 = x0 + k34
k122 = x0 + k35
k123 = x0 + k36
k124 = x0 + k41
k125 = x0 + k44
k126 = x0 + k48
k127 = x0 + k51
k128 = x0 + k63
k129 = x0 + k72
k130 = x0 + k83
k131 = x1 + x3
k132 = x1 + x6
k133 = x4 + k4
k134 = x4 + k14
k135 = x4 + k18
k136 = x5 + k6
k137 = x5 + k53
k138 = x5 + k75
k139 = x7 + k75
k140 = k2 + k53
k141 = k4 + k53
k142 = k5 + k7
k143 = k5 + k18
k144 = k6 + k10
k145 = k6 + k18
k146 = k10 + k75
k147 = k14 + k53
k148 = k18 + k53
```

The output vector y={y0, y1, ..., y840} may be determined from the above results. For illustrative purposes, only parts of the results are shown below.

```
y0   = k94
y1   = x0
y2   = k43
y3   = k76
y4   = k28
...
y834 = x5
y835 = k17
...
y838 = k17
y839 = x5
y840 = x5
```

FIG. 9C is a diagram illustrating the binary (841×4) matrix $B^{(4)}$ according to one embodiment of the invention. The matrix is presented in hexadecimal form, where 4-bit rows are replaced by one hexadecimal value. The rows should be read from left to right.

The multiplication on the matrix $B^{(4)}$ takes a total of 11 additions to produce k0 through k10 values as shown below. The input is an 4-component vector x={x0, x1, ..., x3} and the output is a 841-component vector y={y0, y1, ..., y840}

```
k0  = x1 + x2
k1  = x3 + k0
k2  = x2 + x3
k3  = x1 + x3
k4  = x0 + x1
k5  = x0 + k0
k6  = x0 + k1
k7  = x0 + k2
k8  = x0 + x3
k9  = x0 + k3
k10 = x0 + x2
```

The output vector y={y0, y1, ..., y840} may be determined from the above results. For illustrative purposes, only parts of the results are shown below.

```
y0   = k6
y1   = x0
y2   = x2
y3   = 0
y4   = x1
...
y830 = 0
y831 = 0
...
y838 = k1
y839 = 0
y840 = 0
```

Note that there are 84 zeros in the output vector y. Therefore, the total number of multiplications of the matrix A with the output vector y is reduced by 84, resulting in only 692 multiplications.

FIG. 10 is a diagram illustrating the vector A according to one embodiment of the invention. The vector A has 841 elements from $GF(2^8)$. The integers shown are the decimal representation of the elements of $GF(2^8)$. It is assumed that the primitive polynomial of the finite field is $p(x) = x^8 + x^4 + x^3 + x^2 + 1$.

FIG. 11 is a diagram illustrating a matrix C with a block diagonal structure according to one embodiment of the invention. The matrix C is a binary (255×841) matrix having a block-diagonal structure. The diagonal blocks include a unity element, eight binary (8×27) sub-matrices C8, one binary (4×9) sub-matrix C4, twelve sub-matrices C8, one sub-matrix C4, five sub-matrices C8, one binary (2×3) sub-matrix C2, four sub-matrices C8, one sub-matrix C4, and one sub-matrix C8, located diagonally in that order. Therefore, there are one sub-matrix C2, three sub-matrices C4, and thirty sub-matrices C8.

FIG. 12 is a diagram illustrating the sub-matrices C2, C4, and C8 according to one embodiment of the invention.

The multiplication on matrix C may be split into separate multiplications on matrices C2, C4, and C8. For multiplication on the matrix C2, the input is a 3-component vector $x=(x0, x1, x2)$, and the output is a 2-component vector $y=\{y0, y1\}$. This multiplication takes 2 additions and is performed once because there is only one C2 in C.

$k0=x0+x1; k1=x0+x2$ $y0=k0; y1=k1$

For multiplication on the matrix C4, the input is a 9-component vector $x=\{x0, x1, \ldots, x8\}$, and the output is a 4-component vector $y=\{y0, y1, y2, y3\}$. This operation takes 10 additions and is performed three times because there are 3 C2's in C.

```
k0 = x0 + x1;
k1 = x0 + x2;
k2 = x3 + x6;
k3 = x3 + x8;
k4 = x4 + x5;
k5 = x4 + x7;
k6 = k0 + k2;
k7 = k0 + k4;
k8 = k1 + k3;
k9 = k1 + k5
y0 = k8; y1 = k7; y2 = k6; y3 = k9
```

For multiplication on the matrix C8, the input is a 27-component vector $x=\{x0, x1, \ldots, x26\}$, and the output is an 8-component vector $y=\{y0, y1, \ldots, y7\}$. This operation takes 38 additions and is performed 30 times because there are 30 C8's in C.

```
k0 = x0 + x6
k1 = x1 + x7
k2 = x2 + x8
k3 = x3 + k0
k4 = x4 + k1
k5 = x5 + k2
k6 = x9 + x10
k7 = x9 + x11
k8 = x12 + x13
k9 = x12 + x14
k10 = x15 + x16
k11 = x18 + x19
k12 = x21 + x22
k13 = x24 + x25
k14 = k0 + k1
k15 = k0 + k2
k16 = k3 + k4
k17 = k3 + k5
k18 = x17 + k9
k19 = x20 + k7
k20 = x23 + k9
k21 = x26 + k7
k22 = k6 + k11
k23 = k6 + k13
k24 = k8 + k10
k25 = k8 + k12
k26 = k10 + k17
k27 = k11 + k17
```

-continued

```
k28 = k12 + k15
k29 = k13 + k15
k30 = k14 + k23
k31 = k14 + k25
k32 = k16 + k22
k33 = k16 + k24
k34 = k18 + k26
k35 = k19 + k27
k36 = k20 + k28
k37 = k21 + k29
y0 = k30
y1 = k34
y2 = k33
y3 = k35
y4 = k32
y5 = k36
y6 = k31
y7 = k37
```

Therefore, the total number of additions for the multiplication on the matrix C is 1172.

The total operations in the evaluation of the FFT in equation (10) to find the error locations include 1412 additions and 776 multiplications. As a comparison, the Horner scheme requires 2040 additions and 2040 multiplications. The total operations in the evaluation of the FFT in equation (11) include 1321 additions and 776 multiplications. The total number of operations in the evaluation of the FFT in equation (12) includes 1183 additions and 692 multiplications. Accordingly, the total operations for the error value calculation include 2504 additions and 1468 multiplications. The Horner scheme requires 2550 additions and 2550 multiplications.

FIG. 13 is a diagram illustrating the permutation $\pi$ according to one embodiment of the invention. The permutation $\pi$ shows the re-ordering or re-arrangement of the components in the vector. This operation simply involves routing the connections to the appropriate locations or indexing the appropriate vector locations. It does not take up processing time.

Elements of embodiments of the invention may be implemented by hardware, firmware, software or any combination thereof. The term hardware generally refers to an element having a physical structure such as electronic, electromagnetic, optical, electro-optical, mechanical, electromechanical parts, components, or devices, etc. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory). Examples of firmware may include microcode, writable control store, micro-programmed structure. When implemented in software or firmware, the elements of an embodiment of the present invention are essentially the code segments to perform the necessary tasks. The software/firmware may include the actual code to carry out the operations described in one embodiment of the invention, or code that emulates or simulates the operations. The program or code segments may be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the processor readable or machine accessible medium include an electronic circuit, a semiconductor memory device, a read only memory (ROM), a flash memory, an erasable ROM (EROM), an erasable programmable ROM (EPROM), a floppy diskette, a compact disk (CD) ROM, an optical disk, a hard disk, a fiber optic medium, a radio frequency (RF) link, etc. The machine accessible medium may be embodied in an article of manufacture. The machine accessible medium may include data that, when accessed by a machine, cause the machine to perform the operations described above. The machine accessible medium may also include program code embedded therein. The program code may include machine readable code to perform the operations described above.

All or part of an embodiment of the invention may be implemented by hardware, software, or firmware, or any combination thereof. The hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. An apparatus may include any combination of hardware, software, and firmware modules.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a first multiplier unit to multiply a matrix $B^h$ with a vector v using common adders to produce a column vector v1, the vector v representing one of an error locator polynomial of degree m, an error evaluator polynomial, and a derivative polynomial for a (n, k) Reed-Solomon code, the matrix $B^h$ being over GF(2) including first h columns of a matrix B, h being equal to m+1;
   a second multiplier unit coupled to the first multiplier unit to multiply non-unity components of a column vector A with non-zero components of the column vector v1 component-wise in GF(q) to produce a column vector v2, q being equal to n+1; and
   a third multiplier unit coupled to the second multiplier unit to multiply diagonal sub-matrices of a matrix C with corresponding components of the column vector v2 in GF(2) to produce a column vector v3.

2. The apparatus of claim 1 further comprising:
   a permutator coupled to the third multiplier unit to apply a permutation π to the column vector v3 to generate a Fast Fourier Transform (FFT) F=π(C×(A*($B^h$×v))), x denoting a matrix multiplication and * denoting component-wise multiplication.

3. The apparatus of claim 1 wherein the first multiplier comprises:
   a plurality of first level adders to add pairs of components of the column vector v corresponding to unity values of a row of the matrix $B^h$, the first level adders including common adders; and
   a plurality of second level adders coupled to the first level adders to generate the column vector v1, a subset of the second level adders having inputs coming from one of the common adders from the first level adders.

4. The apparatus of claim 1 wherein the third multiplier unit comprises:
   a plurality of first level adders to add pairs of components of the column vector v corresponding to unity values of a row in one of the diagonal sub-matrices of the matrix C.

5. The apparatus of claim 4 wherein the first level adders include common adders and the third multiplier unit further comprises:
   a plurality of second level adders coupled to the first level adders, a subset of the second level adders having inputs coming from one of the common adders from the first level adders.

6. The apparatus of claim 1 wherein n+255 and k+239.

7. The apparatus of claim 6 wherein the vector A has 841 components with 65 unity components; the matrix $B^h$ is a binary 841×9 matrix, a binary 841×8 matrix, and a binary 841×4 matrix when v represents the error locator polynomial, the error evaluator polynomial, and the derivative polynomial, respectively; the matrix C is a binary 255×841 matrix having a unity element, eight binary 8×27 sub-matrices C8, one binary 4×9 sub-matrix C4, twelve sub-matrices C8, one sub-matrix C4, five sub-matrices C8, one binary 2×3 sub-matrix C2, four sub-matrices C8, one sub-matrix C4, and one sub-matrix C8, located diagonally.

8. A computer-implemented method comprising:
   multiplying a matrix $B^h$ with a vector v stored in a register using common additions to produce a column vector v1, the vector v representing one of an error locator polynomial of degree m, an error evaluator polynomial of degree p, and a derivative polynomial for a (n, k) Reed-Solomon code, the matrix $B^h$ being over GF(2) including first h columns of a matrix B, h being equal to m+1;
   multiplying non-unity components of a column vector A with non-zero components of the column vector v1 component-wise in GF(q) to produce a column vector v2, q being equal to n+1; and
   multiplying diagonal sub-matrices of a matrix C with corresponding components of the column vector v2 in GF(2) to produce a column vector v3.

9. The method of claim 8 further comprising:
   applying a permutation 21 to the column vector v3 to generate a Fast Fourier Transform (FFT) F=π(C+(A* ($B^h$ xv))), x denoting a matrix multiplication and * denoting component-wise multiplication.

10. The method of claim 8 wherein multiplying the matrix $B^h$ with the vector v comprises:
    adding pairs of components of the column vector v corresponding to unity values of a row of the matrix $B^h$ to produce intermediate results, the intermediate results including common results; and
    adding the intermediate results using the common results to generate the column vector v1.

11. The method of claim 8 wherein multiplying the diagonal sub-matrices with the corresponding components of the column vector v2 comprises:
    adding pairs of components of the column vector v corresponding to unity values of a row in one of the diagonal sub-matrices of the matrix C to produce intermediate results.

12. The method of claim 11 wherein the intermediate results include common results and multiplying the diagonal sub-matrices with the corresponding components of the column vector v2 further comprises:

adding the intermediate results using the common results to generate the column vector v3.

13. The method of claim 8 wherein n+255 and k+239.

14. The method of claim 13 wherein the vector A has 841 components with 65 unity components; the matrix $B^h$ is a binary 841×9 matrix, a binary 841×8 matrix, and a binary 841×4 matrix when v represents the error locator polynomial, the error evaluator polynomial, and the derivative polynomial, respectively; the matrix C is a binary 255×841 matrix having a unity element, eight binary 8×27 sub-matrices C8, one binary 4×9 sub-matrix C4, twelve sub-matrices C8, one sub-matrix C4, five sub-matrices C8, one binary 2×3 sub-matrix C2, four sub-matrices C8, one sub-matrix C4, and one sub-matrix C8, located diagonally.

15. A system comprising:

a network interface card (NIC) connected to a network to receive and transmit packets using a Reed-Solomon (RS) code having a code length n and k data symbols, the NIC supporting a full-duplex Gigabit Ethernet interface; and a RS decoder coupled to the NIC to decode the packets, the RS decoder comprising:

an error locator to determine locations of errors in the packets; and an error value calculator coupled to the error locator to determine error values;

wherein each of the error locator and the error value calculator comprises at least a Fast Fourier Transform (FFT) processor, the at least FFT processor comprising:

a first multiplier unit to multiply a matrix $B^h$ with a vector v using common adders to produce a column vector v1, the vector v representing one of an error locator polynomial of degree m, an error evaluator polynomial of degree p, and a derivative polynomial, the matrix $B^h$ being over GF(2) including first h columns of a matrix B, h being equal to m+1, a second multiplier unit coupled to the first multiplier unit to multiply non-unity components of a column vector A with non-zero components of the column vector v1 component-wise in GF(q) to produce a column vector v2, q being equal to n+1, and a third multiplier unit coupled to the second multiplier unit to multiply diagonal sub-matrices of a matrix C with corresponding components of the column vector v2 in GF(2) to produce a column vector v3.

16. The system of claim 15 wherein the at least FFT processor further comprises:

a permutator coupled to the third multiplier unit to apply a permutation π to the column vector v3 to generate a Fast Fourier Transform (FFT) F=π(C×(A*($B^h$×v))), x denoting a matrix multiplication and * denoting component-wise multiplication.

17. The system of claim 15 wherein the first multiplier comprises:

a plurality of first level adders to add pairs of components of the column vector v corresponding to unity values of a row of the matrix $B^h$, the first level adders including common adders; and a plurality of second level adders coupled to the first level adders to generate the column vector v1, a subset of the second level adders having inputs coming from one of the common adders from the first level adders.

18. The system of claim 15 wherein the third multiplier unit comprises:

a plurality of first level adders to add pairs of components of the column vector v corresponding to unity values of a row in one of the diagonal sub-matrices of the matrix C.

19. The system of claim 18 wherein the first level adders include common adders and the third multiplier unit further comprises:

a plurality of second level adders coupled to the first level adders, a subset of the second level adders having inputs coming from one of the common adders from the first level adders.

20. The system of claim 15 wherein n=255 and k=239.

21. The system of claim 20 wherein the vector A has 841 components with 65 unity components; the matrix $B^h$ is a binary 841×9 matrix, a binary 841×8 matrix, and a binary 841×4 matrix when v represents the error locator polynomial, the error evaluator polynomial, and the derivative polynomial, respectively; the matrix C is a binary 255×841 matrix having a unity element, eight binary 8×27 sub-matrices C8, one binary 4×9 sub-matrix C4, twelve sub-matrices C8, one sub-matrix C4, five sub-matrices C8, one binary 2×3 sub-matrix C2, four sub-matrices C8, one sub-matrix C4, and one sub-matrix C8, located diagonally.

22. An article of manufacture comprising:

a machine-accessible storage medium including data that, when accessed by a machine, cause the machine to perform operations comprising:

multiplying a matrix $B^h$ with a vector v using common additions to produce a column vector v1, the vector v representing one of an error locator polynomial of degree m, an error evaluator polynomial of degree p, and a derivative polynomial for a Reed-Solomon code having a code length n and k data symbols, h being equal to m+1;

multiplying non-unity components of a column vector A with non-zero components of the column vector v1 component-wise in Galois Field GF(q) to produce a column vector v2, q being equal to n+1; and multiplying diagonal sub-matrices of a matrix C with corresponding components of the column vector v2 in GF(2) to produce a column vector v3.

23. The article of manufacture of claim 22 wherein the data further comprises data that, when accessed by a machine, cause the machine to perform operations comprising:

applying a permutation π to the column vector v3 to generate a Fast Fourier Transform (FFT) F=π(C×(A*($B^h$× v))), x denoting a matrix multiplication and * denoting component-wise multiplication.

24. The article of manufacture of claim 22 wherein the data causing the machine to perform multiplying the matrix $B^h$ with the vector v comprises data that, when accessed by a machine, cause the machine to perform operations comprising:

adding pairs of components of the column vector v corresponding to unity values of a row of the matrix $B^h$ to produce intermediate results, the intermediate results including common results; and adding the intermediate results using the common results to generate the column vector v1.

25. The article of manufacture of claim 22 wherein the data causing the machine to perform multiplying the diagonal sub-matrices with the corresponding components of the column vector v2 comprises data that, when accessed by a machine, cause the machine to perform operations comprising:

adding pairs of components of the column vector v corresponding to unity values of a row in one of the diagonal sub-matrices of the matrix C to produce intermediate results.

26. The article of manufacture of claim 25 wherein the intermediate results include common results and the data causing the machine to perform multiplying the diagonal sub-matrices with the corresponding components of the column vector v2 further comprises data that, when accessed by a machine, cause the machine to perform operations comprising:

adding the intermediate results using the common results to generate the column vector v3.

27. The article of manufacture of claim 22 wherein n255 and k239.

28. The article of manufacture of claim 27 wherein the vector A has 841 components with 65 unity components; the matrix $B^h$ is a binary 841×9 matrix, a binary 841×8 matrix, and a binary 841×4 matrix when v represents the error locator polynomial, the error evaluator polynomial, and the derivative polynomial, respectively; the matrix C is a binary 255×841 matrix having a unity element, eight binary 8×27 sub-matrices C8, one binary 4×9 sub-matrix C4, twelve sub-matrices C8, one sub-matrix C4, five sub-matrices C8, one binary 2×3 sub-matrix C2, four sub-matrices C8, one sub-matrix C4, and one sub-matrix C8, located diagonally.

* * * * *

UNITED STATES PATENT AND TRADEMARK OFFICE
CERTIFICATE OF CORRECTION

| | | |
|---|---|---|
| PATENT NO. | : 7,685,503 B2 | Page 1 of 1 |
| APPLICATION NO. | : 11/472833 | |
| DATED | : March 23, 2010 | |
| INVENTOR(S) | : Ovchinnikov et al. | |

It is certified that error appears in the above-identified patent and that said Letters Patent is hereby corrected as shown below:

In column 22, at line 18 delete, "n+255 and k+239." and insert --n=255 and k=239.--.

In column 22, at line 46 delete, "21" and insert -- $\pi$--.

In column 23, at line 5 delete, "n+255 and k+239." and insert --n=255 and k=239.--.

In column 26, at line 1 delete, "n255 and k239."and insert --n=255 and k=239.--.

Signed and Sealed this
First Day of March, 2011

David J. Kappos
*Director of the United States Patent and Trademark Office*